United States Patent

Tsugai

[11] Patent Number: 5,977,803
[45] Date of Patent: Nov. 2, 1999

[54] CAPACITANCE TYPE SENSOR INTERFACE CIRCUIT

[75] Inventor: Masahiro Tsugai, Toyko, Japan

[73] Assignee: Mitsubishi Denki Kabushiki Kaisha, Tokyo, Japan

[21] Appl. No.: 08/914,210

[22] Filed: Aug. 19, 1997

[30] Foreign Application Priority Data

Feb. 24, 1997 [JP] Japan .................................. 9-039320

[51] Int. Cl.[6] .................................................. G11C 27/02
[52] U.S. Cl. ........................................... 327/94; 327/337
[58] Field of Search ............................... 327/77, 91, 92, 327/93, 94, 95, 96, 337, 554, 509, 516, 517; 330/9; 73/514.32

[56] References Cited

U.S. PATENT DOCUMENTS

| | | | |
|---|---|---|---|
| 4,375,595 | 3/1983 | Ulmer et al. | 327/378 |
| 5,281,860 | 1/1994 | Krenik et al. | 327/91 |
| 5,425,650 | 6/1995 | Frick | 324/688 |
| 5,633,594 | 5/1997 | Okada | 324/679 |
| 5,724,095 | 3/1998 | Shyu et al. | 327/9 |
| 5,751,154 | 5/1998 | Tsugai | 324/661 |
| 5,751,189 | 5/1998 | Shyu et al. | 330/9 |

FOREIGN PATENT DOCUMENTS 228 132 10/1985 Germany .

OTHER PUBLICATIONS

Leuthold, H.; Rudolf, F., An ASIC for High–resolution Capacitive Microaclerometer, Sensors and Actuators A21–A23 (1990) pp. 278–281.

*Primary Examiner*—Toan Tran
*Attorney, Agent, or Firm*—Sughrue, Mion, Zinn, Macpeak & Seas, PLLC

[57] ABSTRACT

In an interface circuit connected to a capacitance type sensor having two sets of capacitors C1 and C2 whose capacitances are varied, this interface circuit is equipped with an OP amplifier A1 where a feedback/sampling capacitor C3 is connected between its output terminal and its inverting input terminal; and a holding capacitor C4 connected between a non-inverting terminal of the OP-amplifier A1 and a reference voltage source; one ends of the respective capacitors C1, C2, C3 are connected to the inverting input terminal of the OP amplifier A1; at timing φ1 of a switching cycle, the other ends of the respective capacitors C1, C2 are connected to a power source and the capacitor C3 is shortcircuited; at timing φ2 thereof, the other ends of the capacitors C1, C2 and an output terminal of the OP amplifier A1 are connected to the non-inverting input terminal of the OP amplifier A1; and the switched capacitor type interface interface circuit further includes: a multiplexer for sequentially connecting a plurality of the capacitance type sensors to the capacitance type sensor interface circuit in a second switching cycle having a time period longer than time periods of the switching cycles φ1 and φ2; and a plurality of sample/hold circuits whose quantity is equal to those of the plural capacitance type sensors, which are sequentially connected to the capacitive type sensor interface circuit in response to the connections of the plural capacitance type sensors in the second switching cycle.

3 Claims, 8 Drawing Sheets

φ1: SW1, SW4, SW5, SW8
φ2: SW2, SW3, SW6, SW7

CAPACITANCE TYPE SENSOR INTERFACE CIRCUIT

BACKGROUND OF THE INVENTION

1. Field of the Invention

The present invention relates to a capacitance detecting circuit of a capacitance detecting type sensor such as a pressure sensor, an acceleration sensor, and an angular velocity sensor utilized in vibration measurements, vehicle controls, and motion controls.

2. Description of the Related Art

Very recently, specific attentions are paid to inertia sensors capable of detecting pressure of fluids, and pressure, acceleration, or angular velocity applied to moving objects, in particular to such inertia sensors which utilize the micromachining technique of semiconductor industries and may detect measurement signals by detecting changes in capacitances of a capacitor. These sensors own merits, for instance, a compactness of an apparatus, mas-producibility, high precision, and high reliability.

FIG. 13 is a sectional structural diagram for showing a typical capacitance type acceleration sensor which is manufactured by employing the micromachining process of semiconductor. This sensor owns a structure such that a silicon mass member 1 is supported through a beam 3 by an anchor portion 2. Fixed electrodes 4 and 5 are formed above/beneath this mass member 1 on glass, or silicon 6. The mass member 1 and the fixed electrodes 4, 5 constitute capacitors 7 and 8 shown in FIG. 14. These capacitors 7 and 8 may constitute a sensor element 9.

When inertia force caused by acceleration is exerted on the mass member 1 along an x direction, the mass member 1 is displaced. Due to this displacement, one capacitance value between the mass member 1 and the fixed electrodes 4, 5 is increased (C+ΔC), and the other capacitance value between them is decreased (C−ΔC). A change in the capacitance values is converted into a voltage output.

As the method for converting the change in the capacitance values in response to the displacement of the mass member 1 into the voltage output, for instance, an example of the interface circuit for utilizing the switched capacitor circuit is described in the publication written by H.LEUTHOLD and F.RUDOLF, An ASIC for High-resolution Capacitive Microaccelerometers, Sensors and Actuators, A21–A23, 1990, pages 278 to 281.

FIG. 15 is a circuit diagram for representing an example of a capacitance type sensor interface circuit to which the above-described conventional switched capacitor circuit is applied. FIG. 16 shows timing of clock signals φ1 and φ2 for the respective switches indicated in FIG. 15. The clock signals φ1 and φ2 alternately become ON (High). In order that these clock signals are not turned ON together, a common OFF (Low) time period is provided.

At the timing of the clock signals φ1, the power source voltage Vs and the ground (Gnd) are connected to both terminals of the sensor element 9, and at this time, an error charge ΔQ corresponding to a difference in the capacitances of the capacitors C1 and C2 is sampled by a switched capacitor circuit 10 connected subsequent to this sensor element 9. As a result, an error voltage Vm (=Vout−Vr) in response to the error charge ΔQ is produced, this error voltage is held in the capacitor C5 at the timing of the clock signal φ2 through a voltage hold/feedback circuit 11 connected subsequent to this switched capacitor circuit 10, and further, this error voltage Vm is fed back to the capacitor C6.

Accordingly, the potential at the non-inverting input of a first-staged OP amplifier for constituting the switched capacitor circuit 10 becomes higher/lower than the reference voltage Vr in response to the symbol of the error charge ΔQ. This error voltage Vm is changed in stepwise every switching cycle, and then becomes a constant value expressed by the below-mentioned formula (1) at a time instant when the error charge ΔQ becomes zero, namely being brought into such a condition that the same charges are accumulated into the capacitor C1 and the capacitor C2 every time.

For the sake of convenience, assuming now that an input offset voltage is commonly used for the first-staged OP amplifier and the second-staged OP amplifier, namely is set to "Vos", and also Vr=Vs/2, the error voltage is given by:

$$Vout = \{C1/(C1+C2)\} \cdot Vs + \{C3/(C1+C2)\} \cdot Vos \quad (1)$$

$$= \{1 + (C1-C2)/(C1+C2)\} \cdot Vs/2 + \{C3/(C1+C2)\} \cdot Vos$$

$$= \{1+S\} \cdot Vs/2 + C3/(C1+C2) \cdot Vos$$

In this formula, symbol S=(C1−C2)/(C1+C2) indicates an index of a sensor sensitivity, and an essential sensitivity becomes S/2.

In the above case, it is assumed that the capacitance type sensor interface circuit is driven under single power source Vs. Alternatively, assuming now that the capacitance type sensor interface circuit is driven under positive/negative 2 power sources of ±Vs/2, and also Vr is equal to a zero potential, if the formula (1) is rewritten, then the following formula (2) is given as follows:

$$Vout = \{(C1-C2)/(C1+C2)\} \cdot Vs/2 + \{C3/(C1+C2)\} \cdot Vos \quad (2)$$

$$= S \cdot Vs/2 + C3/(C1+C2) \cdot Vos$$

As indicated in the formula (1) or (2), the output voltage Vout may be expressed by a summation of the DC offset voltages in correspondence with the output voltage corresponding to the capacitance difference produced in response to the displacement of the mass member 1 caused by the acceleration, and the input offset voltage Vos of the OP amplifier.

On the other hand, since the error voltage Vm is fed back, it is required to satisfy the formula (3) as a stability condition.

In this formula, symbol "Co" is equal to initial capacitances (C1=C2=Co) of the capacitor C1 and the capacitor C2 when the capacitance difference (C1−C2) caused by the displacement of the mass member 1 in response to the acceleration becomes zero.

$$Co/\{1-[(C1-C2)/(C1+C2)]^2\} \times C4/(C3 \times C5) < 1 \quad (3)$$

As described above, in accordance with the conventional method, C3 must be set to be small and Co must be set to be large in order to reduce the DC offset voltage. However, when C3 is set to be small, there is a drawback that the stable characteristic (converging characteristic) expressed by the formula (3) would be deteriorated.

Also, since the offset output voltages Vos of the OP amplifiers are fluctuated, depending upon the respective OP amplifiers, and are varied in response to the temperatures, the DC offset voltage expressed by the formula (1) is similarly fluctuated and thus represents the temperature depending characteristic.

Since the conventional capacitance detecting circuit is constructed by employing the above-described arrangement, the four capacitors (C3 to C6) are required as the passive element, and at least two sets of OP amplifiers are required as the active element in the capacitance type sensor interface circuit arrangement shown in FIG. 15. As a result, the area of the semiconductor IC circuit would be increased, and thus the dimension of the IC chip would be increased. There is a problem that the cost of the circuitry IC would become higher.

Also, when a plurality of sensor elements are employed, since the same detecting circuits must be provided with the respective capacitance type sensors, the detecting circuits whose quantity is equal to that of the sensors are required. As a consequence, there is another problem that the entire circuit can be hardly made compact.

SUMMARY OF THE INVENTION

The present invention has been made to solve the above-described problems of the prior art, and therefore has an object to provide a compact capacitance type sensor interface circuit made in low cost in such a manner that an arrangement thereof is made simple, even when this capacitance type sensor interface circuit is manufactured in an ASIC form, this ASIC can be made in low cost, and moveover even when a plurality of capacitance type sensors are employed, only one impedance converting circuit is commonly used to the plural sensors.

A capacitance type sensor interface circuit, according to a first arrangement of the present invention, is featured by that in a switched capacitor type interface circuit connected to a capacitance type sensor having two capacitances C1 and C2, at least one of values of which is varied, the switched capacitor type interface circuit is comprised of an OP amplifier A1 in which a feedback/sampling capacitor C3 is connected between an output terminal thereof and an inverting input terminal thereof; and a holding capacitor C4 connected between a non-inverting terminal of the OP amplifier A1 and a reference voltage source; wherein:

one ends of the respective capacitors C1, C2, C3 are connected to the inverting input terminal of the OP amplifier A1;

at timing $\phi1$ of a switching cycle, the other ends of the respective capacitors C1, C2 are connected to a power source and the capacitor C3 is shortcircuited;

at timing $\phi2$ thereof, the other ends of the capacitors C1, C2 and an output terminal of the OP amplifier A1 are connected to the non-inverting input terminal of the OP amplifier A1; and the switched capacitor type interface interface circuit is further comprised of:

a multiplexer for sequentially connecting a plurality of the capacitance type sensors to the capacitance type sensor interface circuit in a second switching cycle having a time period longer than time periods of the switching cycles $\phi1$ and $\phi2$; and a plurality of sample/hold circuits whose quantity is equal to those of the plural capacitance type sensors, which are sequentially connected to the capacitive type sensor interface circuit in response to the connections of the plural capacitance type sensors in the second switching cycle.

A capacitance type sensor interface circuit, according to a second arrangement of the present invention, is featured by that:

the capacitance type sensor corresponds to two sets of capacitance type sensors used in a full-bridge connection; and the capacitance type sensor interface circuit is further comprised of a differential amplifier circuit for outputting a difference in output voltages of two sets of the sample/hold circuits provided in correspondence with two sets of the capacitance type sensors.

A capacitance type sensor interface circuit, according to a third arrangement of the present invention, is featured by that:

the multiplexer connected to one set of the capacitance type sensor, alternately reverses the connection to the power source in the second switching cycle with respect to one set of the capacitance type sensor.

DETAILED DESCRIPTION OF THE PREFERRED EMBODIMENTS

Hereinafter, preferred embodiments of the present invention will be described in more detail with reference to the accompanying drawings.

EMBODIMENT 1

Figure 1:
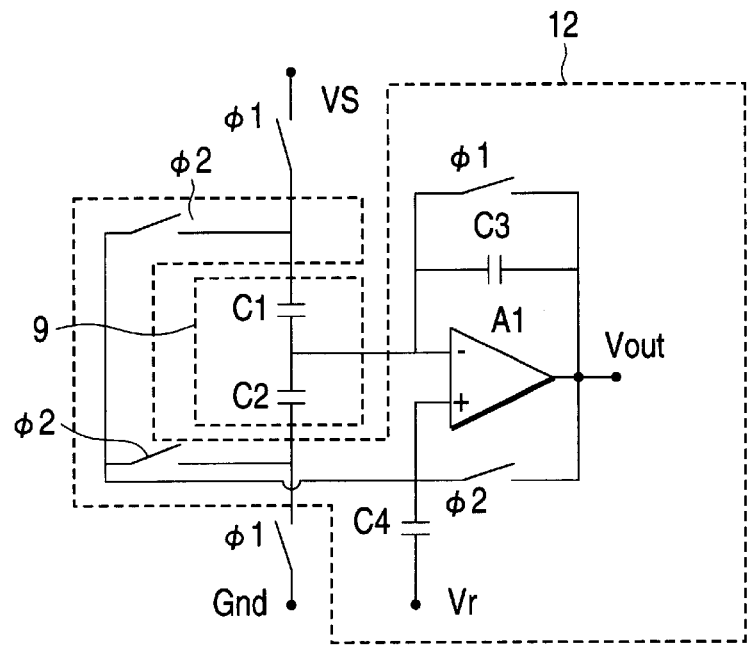
FIG. 1 is a circuit diagram for showing an example of a capacitance type sensor interface circuit according to an embodiment 1 of the present invention.

Now, a description will be made of a capacitance type sensor interface circuit according to an embodiment 1 of the present invention. FIG. 1 is a circuit diagram for indicating one example of a capacitance detecting circuit according to the embodiment 1. This circuit includes a sensor element 9, an OP amplifier A1, a feedback/sampling capacitor C3, and a holding capacitor C4. One set of the OP amplifier A1, the feedback/sampling capacitor C3, and the holding capacitor C4 will constitute a switched capacitor circuit and voltage hold/feedback circuit 12.

In this circuit, a reference voltage is equal to that of the prior art, namely Vr (=Vs/2), and an error voltage Vm is gradually approximated to an output voltage Vout.

At timing of the clock $\phi 1$, electron charges are stored into the respective capacitors C1 and C2 of the sensor element 9, and at timing of the clock $\phi 2$, a difference $\Delta Q$ between the charges stored in the capacitors C1 and C2 is converted into a potential difference $\Delta V$ by such a capacitor constituted as a summation of (C1+C2) and a feedback capacitor C3 of the OP amplifier. At this time, since the output terminal of the OP amplifier is connected to the non-inverting input terminal of the OP amplifier at the same timing as that of the clock $\phi 2$, this potential difference $\Delta V$ is applied to the OP amplifier as a potential difference between the inverting input terminal thereof and the non-inverting input terminal thereof. As a result, the output from the OP amplifier is varied above/below in response to symbols of the potential difference $\Delta V$ (namely, large/small values of V+ and V−). Then, in response to the potential of Vout, the charges are entered from the OP amplifier into the capacitor C4, or flow from the OP amplifier to the capacitor C4. At the clock $\phi 1$, a voltage across the terminals of the capacitor C4 may hold such a potential immediately before the clock $\phi 2$ is changed into Low. Such an operation is repeatedly performed, so that similar to the formula (1) or the formula (2), the voltage at the inverting input terminal of the OP amplifier, or the voltage at the non-inverting input terminal thereof becomes such a voltage that the same charges are stored in the capacitor C1 and the capacitor C2, namely a constant voltage.

In other words, the function similar to that of the prior art may be realized by such a simple arrangement that a single OP amplifier A1, the sensor element 9, the feedback/sampling capacitor C3, and the holding capacitor C4. It should be understood that when the input offset voltage Vos appears between the input terminals of the OP amplifier, the offset output voltage expressed by the formula (1) is produced.

Figure 2:
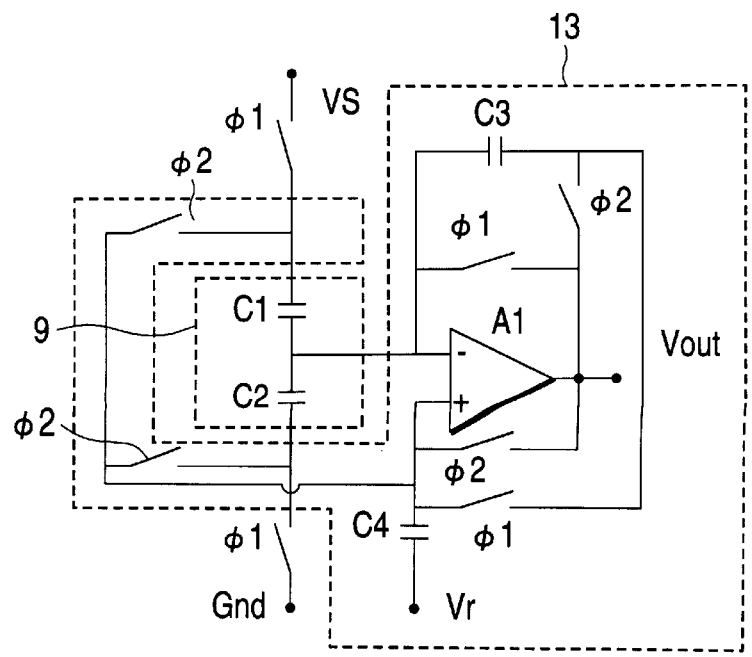
FIG. 2 is a circuit diagram for showing another example of a capacitance type sensor interface circuit according to the embodiment 1 of the present invention.

FIG. 2 is a circuit diagram for another example of the capacitance type sensor interface circuit according to the embodiment 1 of the present invention. A basic circuit arrangement of this capacitance type sensor interface circuit is common to that of FIG. 1. However, a switched capacitor/feedback circuit 13 is such a circuit having a function for compensating the input offset voltage Vos of the OP amplifier.

At timing of the clock $\phi 1$, the feedback capacitor/sampling capacitor C3 of the OP amplifier is stored by charges Q3 by the input offset voltage Vos.

On the other hand, charges Q1 and Q2 are stored in the capacitors C1 and C2 for constituting the sensor element 9.

$$Q1=[Vs-(Vos+Vm)]\cdot C1$$

$$Q2=[Vos+Vm]\cdot C2$$

$$Q3=Vos\cdot C3 \tag{4}$$

In this case, symbol "Vm" implies a potential at the non-inverting input terminal of the OP amplifier in the clock $\phi 1$ during a certain sampling operation, and symbol Vs indicates an input voltage source voltage.

At the clock $\phi 2$, the capacitor C3 is coupled to the capacitors C1, C2, and a summed capacitance becomes C1+C2+C3. When a charge amount stored in this coupled capacitor causes Vos as the voltage across the inverting input terminal and the non-inverting input terminal of the OP amplifier, the output voltage of the OP amplifier becomes a constant value Vout. Accordingly, the following formula (5) can be satisfied:

$$Vos=(Q1-Q2+Q3)/(C1+C2+C3) \tag{5}$$

When the formula (5) is substituted for the formula (6) to be simplified, the output voltage is given as follows:

$$Vout=[C1/(C1+C2)]\cdot Vs \tag{6}$$

As a result, the output voltage Vout of the OP amplifier could not be, in principle, influenced by Vos.

As previously explained, in accordance with the circuit arrangement shown in FIG. 2, since the output voltage does not contain such a term depending on the input offset voltage Vos of the OP amplifier, the variation contained in the output voltage can be eliminated which depends upon the variation in Vos caused by the temperature changes. Therefore, it is possible to provide the interface circuit for the capacitance detecting type sensor whose DC offset output is very stable.

In other words, since the voltage appearing at the non-inverting input terminal of the OP amplifier is determined in such a way that only the necessary error charges are stored in the sampling capacitor and the charged result is reflected, the adverse influence of the input offset voltage Vos between the non-inverting terminal of the OP amplifier and the inverting input terminal thereof with respect to the output voltage can be avoided.

Figure 3:
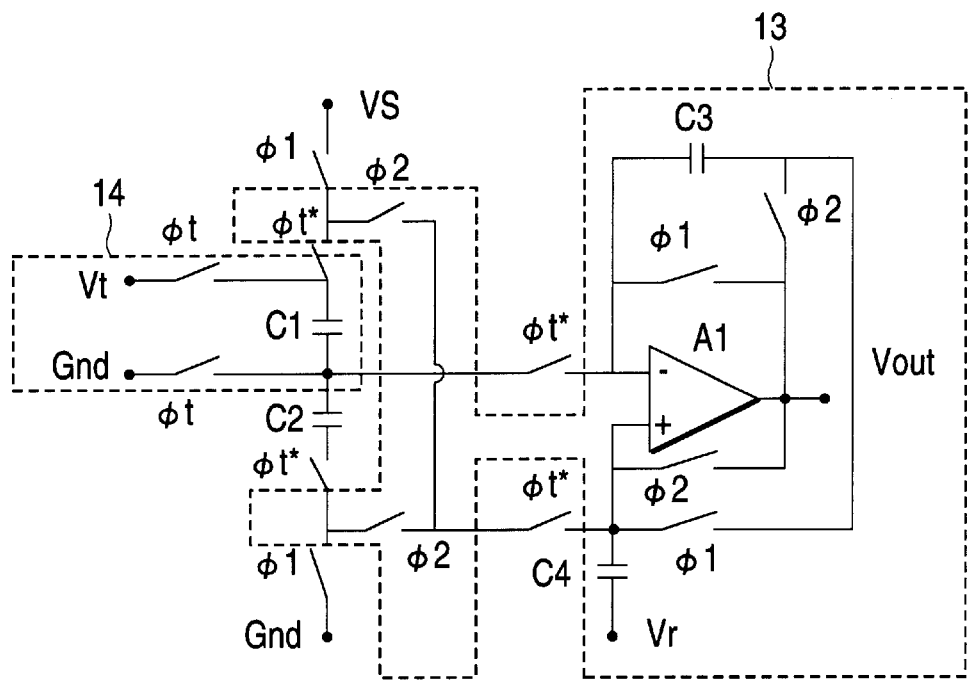
FIG. 3 is a circuit diagram for showing a further example of a capacitance type sensor interface circuit according to the embodiment 1 of the present invention.
Figure 4:
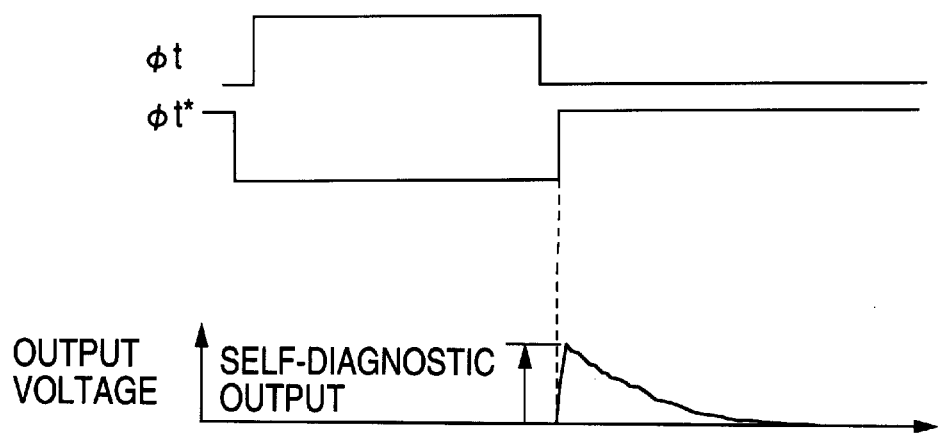
FIG. 4 is an explanatory diagram for representing clock timing used to drive switches for self-diagnostic purposes, and also self-diagnostic waveforms outputted in synchronism with this switch driving operation in the capacitance type sensor interface circuit of FIG. 3.

In FIG. 3, there is shown an example of a detecting circuit equipped with a self-diagnostic function by that a mass member is driven by electrostatic force so as to confirm normal displacement of the mass member. Reference numeral 14 is a self-diagnostic drive circuit. Referring now to a self-diagnostic timing chart shown in FIG. 4, this self-diagnostic drive circuit will be explained. When a self-diagnostic pulse "$\phi t$" becomes High (ON), a drive voltage Vt is applied between a fixed electrode and the mass member, which constitute the capacitor C1. As a result, the mass member is attracted to the fixed electrode by the electrostatic force, and thus is displaced. At this time, since the switch corresponding to $\phi t^*$ is brought into the OFF state, a switched capacitor/feedback circuit 13 is electrically cut out from the sensor element 9, so that the output of the detecting circuit becomes the reference voltage Vr.

On the other hand, when the self-diagnostic pulse $\phi t$ becomes OFF and $\phi t^*$ is brought into ON state, the present operation mode is switched to the normal detection phase (displacement detection mode), and such as output voltage Vout corresponding to the charge conditions of the capacitors C1 and C2 is outputted. It should be noted that since a time period "Ts" of a sampling clock of the detecting circuit is set to be very smaller than response time constants of the mass member and the switched capacitor circuit, the displacement defined by that the mass member is released from the electrostatic force by the drive voltage and then is returned to a neutral point is monitored as a transition waveform of the output voltage of the detecting circuit. As a result, since this output waveform is used as the self-diagnostic output, the normal operation of the mass member can be confirmed.

This self-diagnostic drive circuit 14 is added to the switched-capacitor circuit and voltage hold/feedback circuit 12 indicated in FIG. 1, so that such a self-diagnostic operation as to whether or not the mass member is displaced under normal condition can be performed.

In other words, the fixed electrode can be utilized as the self-diagnostic electrode, and the drive potential itself can be applied as the potential difference between the fixed electrode and the mass member.

Figure 5:
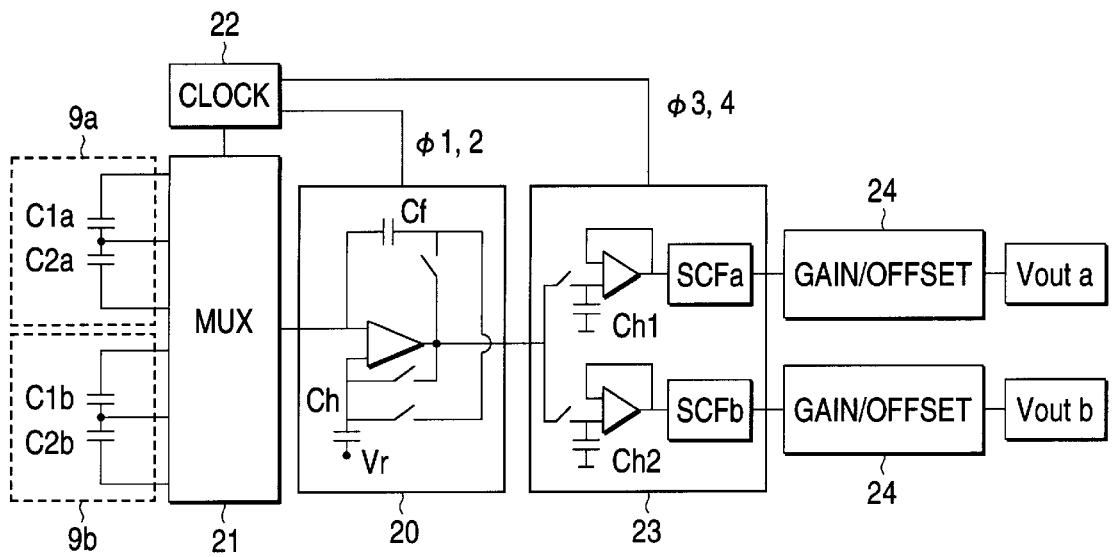
FIG. 5 is a circuit diagram for indicating a capacitance type sensor interface circuit of the embodiment 1 of the present invention.
Figure 6:
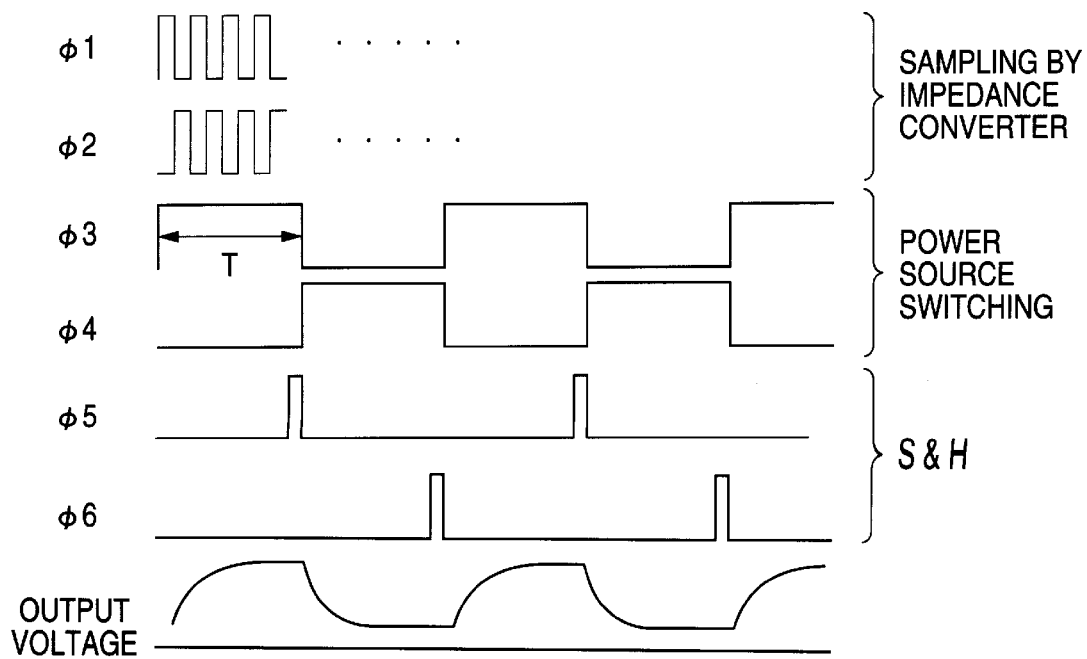
FIG. 6 is an explanatory diagram for showing clock timing used to drive the switches according to the embodiment 1 of the present invention.

FIG. 5 is a circuit diagram defined by that in the interface circuit of the capacitance type sensor according to the embodiment 1 of the present invention, two sets of capacitance type sensor elements 9a and 9b are connected to the above-described interface circuit, as will be explained later. FIG. 6 is a waveform diagram for representing clock timing used to drive switches employed in the interface circuit for this capacitance type sensor.

Figure 7:
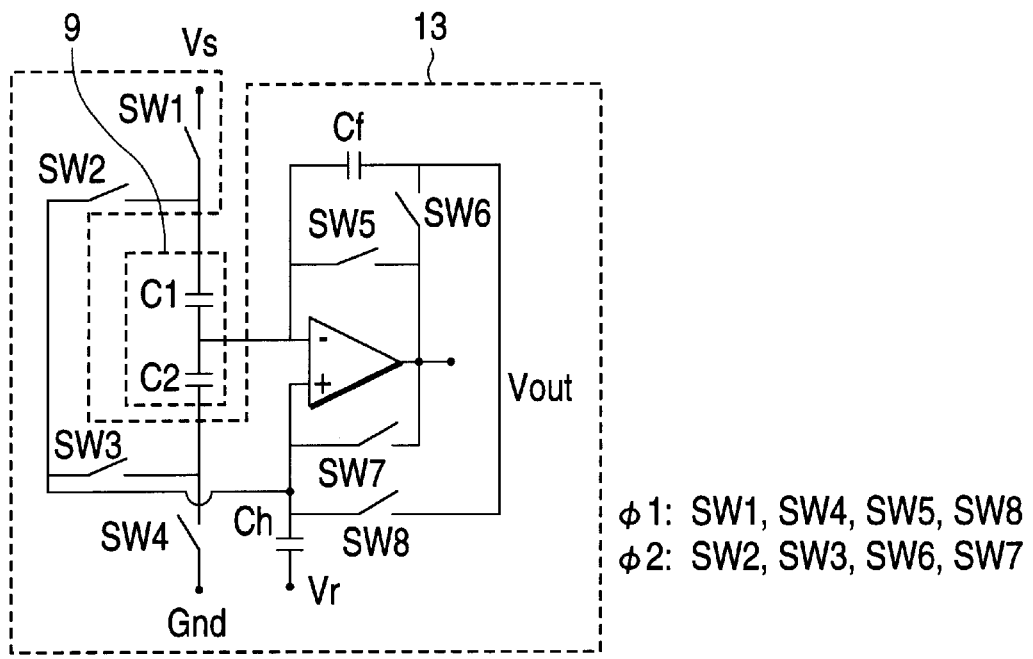
FIG. 7 is a circuit diagram for showing another example of the capacitance type sensor interface circuit according to the embodiment 1 of the present invention.

Reference numeral 20 indicates an impedance converting circuit equipped with a function capable of outputting the voltage value expressed by the formula (1) under a low impedance. It should be noted that a total number of this impedance converting circuit 20 is 1. Reference numeral 21 shows an MUX which owns four switches SW1 to SW4 (shown in a circuit diagram of FIG. 7) with respect to the respective sensor elements indicated by 9a and 9b and the reference power source Vs. This MUX21 corresponds to a switch and the reference power source, which owns a role of a multiplexer newly equipped with switches for selecting the respective sensor elements, and the quantity of these switches are equal to those of the sensor elements. Reference numeral 22 shows an oscillator circuit for defining the switching timing of the switch shown in FIG. 6, namely a clock source. Reference numeral 23 is a sample-hold/filter circuit containing a sample/hold(S & H) circuit, and an SCF(switched capacitor filter). The sample/hold circuit samples the voltage of the impedance converting circuit 20, which has been sampled at measurement timing of the respective sensor elements, and this sampled value is held by a holding capacitor "Ch". The SCF cuts off an unwanted frequency range. Reference numeral 24 is digital trimming circuits for controlling the offset value and the sensitivities of the sensor outputs for the respective sensors, which are outputted from the S & H filter circuit 23. Each of the digital trimming circuits 24 includes a serial-to parallel converter, a D/A converter, and an EEPROM. Since these sample hold/filter circuit 23 and trimming circuit 24 are specific to the sensor elements, these circuit elements are required for each of the sensor elements.

The MUX 21 converges the output voltages of the impedance converting circuit 20 with respect to the respective sensors at the measurement timing of the clock signals $\phi 1$ and $\phi 2$ indicated in FIG. 6, switches the respective sensors at timing $\phi 3$ and $\phi 4$ of time T which is made longer than such time that the output of the impedance converting circuit 20 sufficiently becomes stable (converged), and samples/holds the output voltage of the impedance converting circuit 20 with respect to the respective sensors.

In accordance with this embodiment 1, the impedance converting circuit 20 for performing the impedance conversions of the sensor signals, which constitutes the basic circuit of the capacitance type sensor interface circuit is integrated into a single impedance converting circuit which can be commonly used to all of the sensor elements. As a consequence, the number of the impedance converting circuits which are required for the respective sensors in the conventional capacitance type sensor interface circuit can be considerably reduced. Accordingly, in such a case that more than two sets of capacitance type sensor elements are employed, the circuit scale can be reduced. It is possible to realize the low-cost capacitance detecting circuit interface with the high reliability. For instance, the present inventive idea may be applied to such a capacitance type sensor whose sensitivity and also output linearity characteristic can be improved, and to a multi-axes detecting type acceleration sensor. Even when the interface circuit is made in the ASIC form, the entire circuit can be made in low cost.

EMBODIMENT 2

Figure 8:
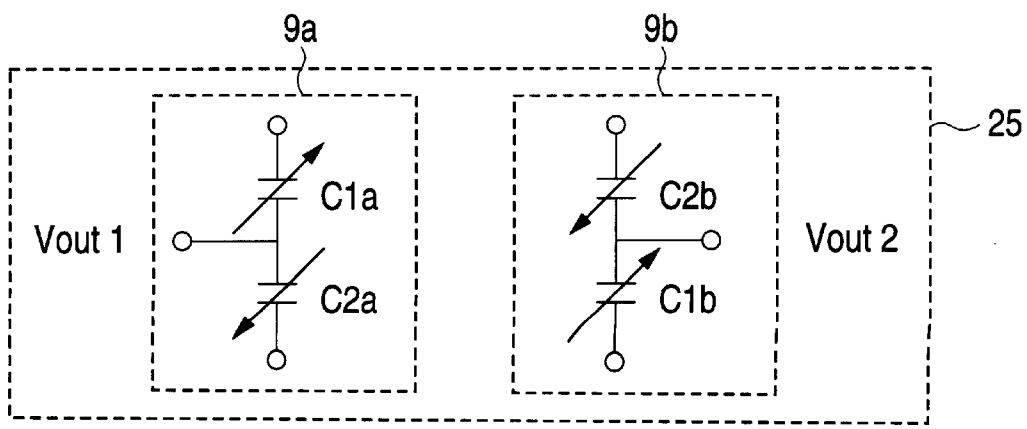
FIG. 8 is a circuit diagram for indicating an example of a full-capacitance bridge type sensor element of the capacitance type sensor interface circuit according to the embodiment 2 of the present invention.
Figure 9:
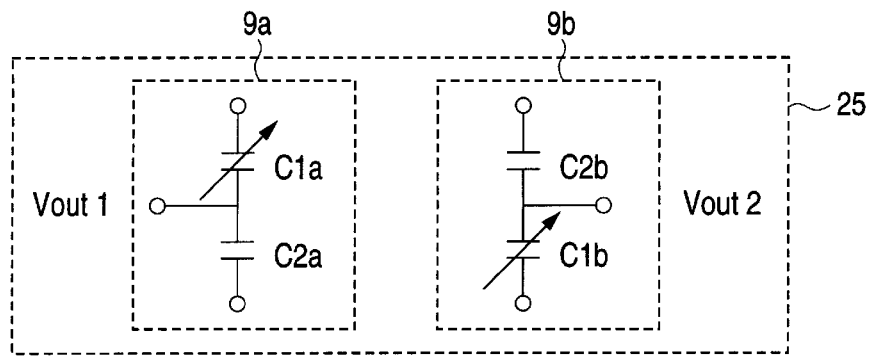
FIG. 9 is a circuit diagram for indicating another example of a full-capacitance bridge type sensor element of the capacitance type sensor interface circuit according to the embodiment 2 of the present invention.
Figure 10:
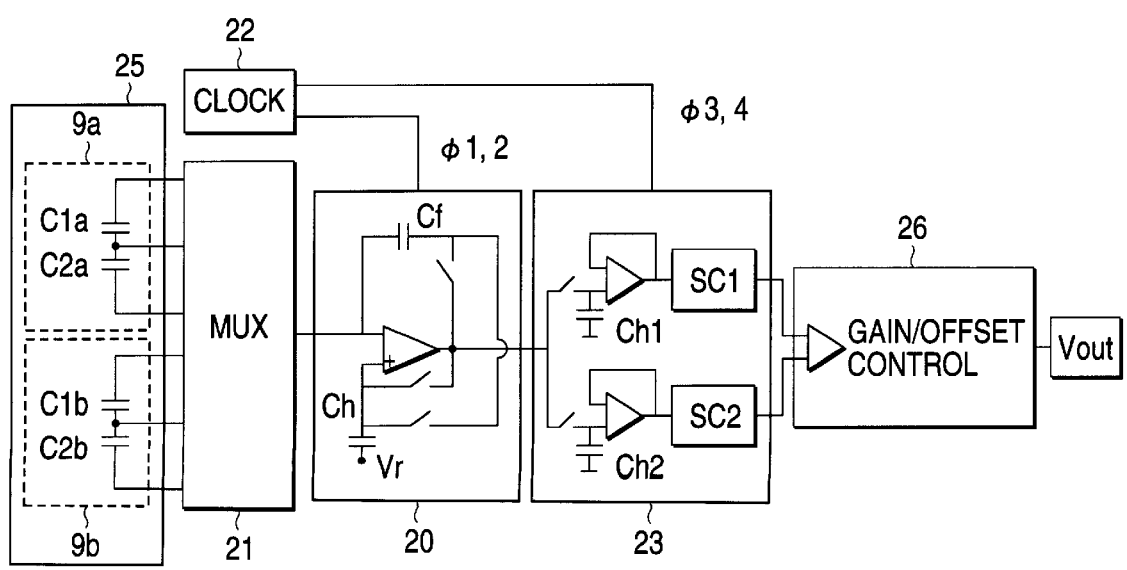
FIG. 10 is a circuit diagram for representing a capacitance type sensor interface circuit according to an embodiment 2 of the present invention.

FIG. 8 and FIG. 9 are circuit diagrams for representing one example of a full-capacitance bridge type sensor element 25, according to an embodiment 2 of the present invention, which use sensor elements 9a and 9b in a full bridge arrangement. FIG. 10 is a circuit diagram for indicating an interface circuit of a capacitance type sensor according to this embodiment. This embodiment 2 is such an example that, as shown in FIG. 8, two sets of differential capacitance detecting type sensors 9a and 9b are arranged in a full-capacitance bridge form. Each of sensor outputs is expressed in a similar manner to the above-mentioned embodiment 1 as follows:

$$\text{Vout1} = C1a/(C1a+C2a) \cdot Vs$$

$$\text{Vout2} = C2b/(C1b+C2b) \cdot Vs$$

The above-described outputs Vout1 and Vout2 which have been detected at the different time by the impedance converting circuit 20 shown in FIG. 10, and have been held/shaped by the sample hold/filter circuit 23 are processed by a differential amplifying/trimming circuit 26 in such a manner that a difference is calculated, and a gain and an offset are digitally trimmed. For the sake of convenience, assuming now that $C1a=C1b$ (=C1) and $C2a=C2b$ (=C2), the below-mentioned equation can be established:

$$Vout1 - Vout2 = (C1 - C2)/(C1 + C2) \cdot Vs \qquad (8)$$

$$= S \cdot Vs$$

It may be recognized that the sensitivity of the full-capacitance bridge becomes "S", namely twice, as compared with the sensitivity of S/2 in either the formula (1) or the formula (2) in the case of the above-explained half capacitance bridge. As described above, even in such a case that the capacitance type sensor is arranged by way of the full bridge form in order to increase the sensor sensitivity, the impedance converting circuit 20 is integrated into a single impedance converting circuit, so that the resultant circuit scale of the sensor interface circuit can be reduced, as compared with that of the prior art.

Also, even when a plurality of differential capacitance type sensors are employed, the circuits of the basic detecting unit capable of detecting the changes in the capacitances of the respective sensors are made up as a common detecting circuit. Accordingly, the circuits can be made simple, and further a total number of the constructed active elements can be reduced. There is such an effect that the IC chip area can be made small. Since two sets of the differential capacitance type sensors are arranged one by one to thereby constitute the full bridge circuit, the sensitivity of this sensor can be made two times higher than that of the conventional sensor, i.e., one set of the differential capacitance type sensor.

Also, as indicated in FIG. 9, in such a case that a capacitance type sensor element is not constituted by a differential capacitance (such an arrangement that one of capacitances of sensors 9a and 9b is decreased and the other capacitance is increased), either the formula (1) or the formula (2) is not directly proportional to a relative displacement amount of the electrodes, in principle, but represents a non-linear characteristic. In such a case, as shown in FIG. 9, the same capacitance type sensor elements are arranged in a full bridge arrangement. As a consequence, although the sensitivity of this full bridge type sensor is reduced by ½, as compared with the above-mentioned case that the differential type sensor elements shown in FIG. 8 are arranged in the full bridge arrangement, it is possible to obtain such a linear sensor output which is directly proportional to the relative displacement amount of the interval between the electrodes. It should be understood that also in this case, since the sensor circuit of FIG. 9 is arranged similar to that of FIG. 10, the resultant circuit scale can be reduced, as compared with the prior art.

EMBODIMENT 3

Figure 11:
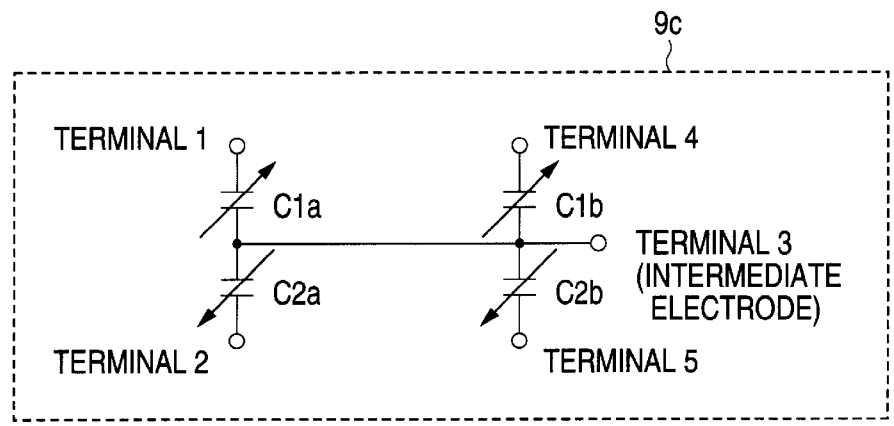
FIG. 11 is a circuit diagram for representing a capacitance type sensor interface circuit according to an embodiment 3 of the present invention.
Figure 13:
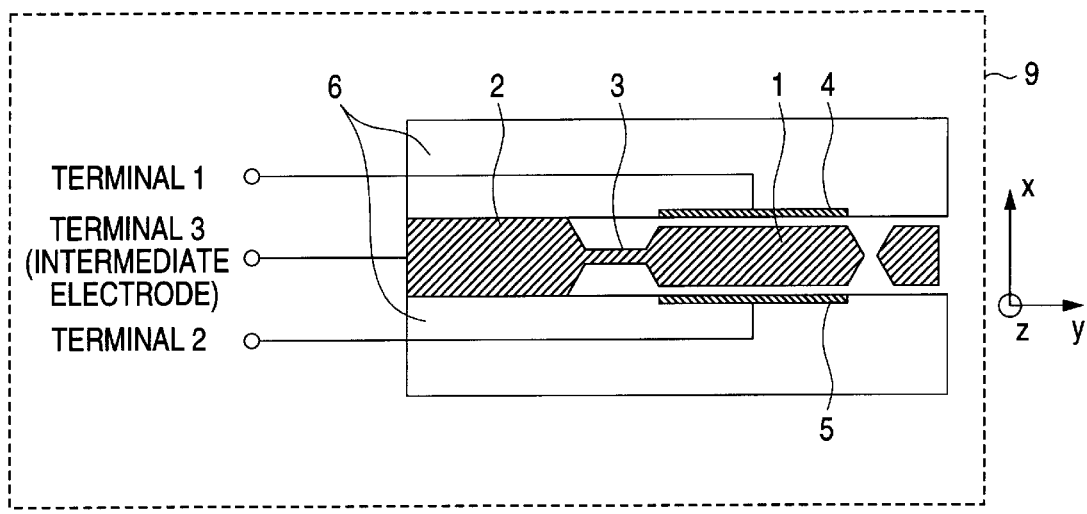
FIG. 13 is a sectional structural diagram for indicating one example of the conventional capacitance type acceleration sensor.
Figure 14:
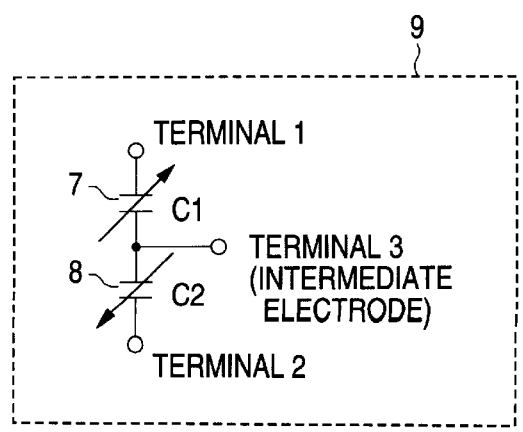
FIG. 14 is a circuit diagram for indicating an equivalent circuit of the conventional capacitance type acceleration sensor.
Figure 15:
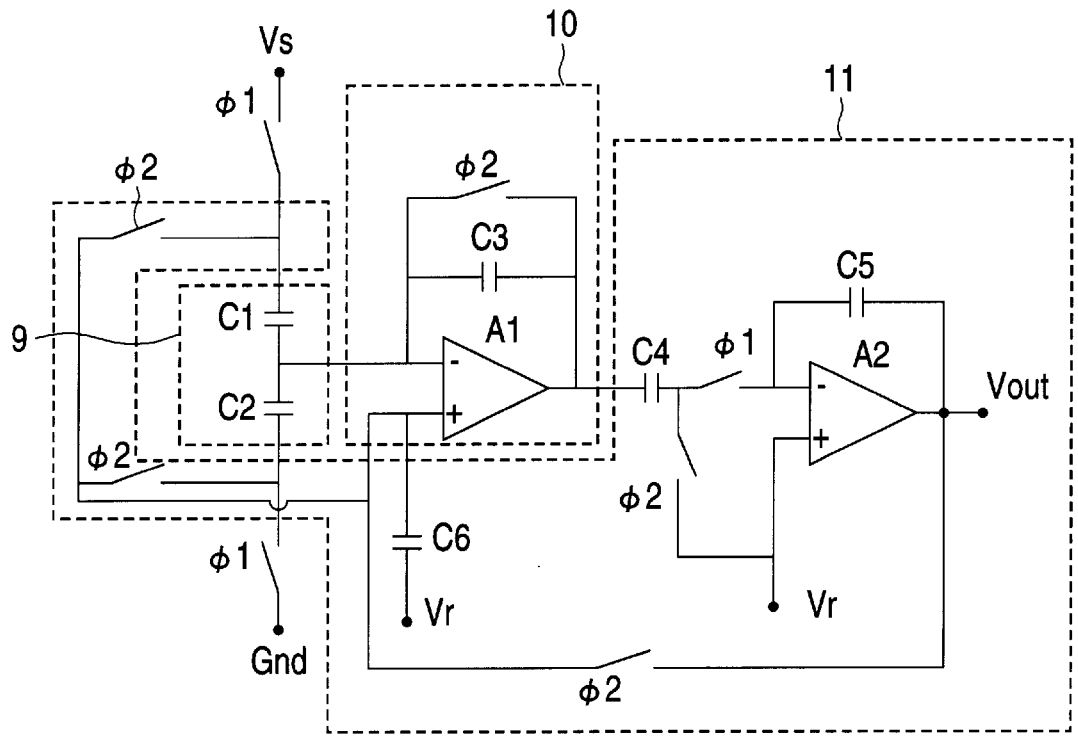
FIG. 15 is a waveform diagram for showing the clock timing used to drive the switches of the conventional capacitance type sensor interface circuit.
Figure 16:
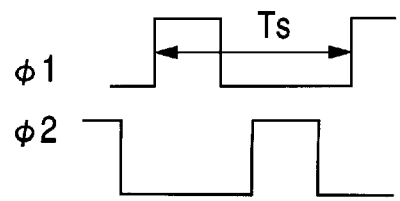
FIG. 16 is a timing chart showing timing of clock signals for the respective switches indicated in FIG. 15.

FIG. 11 is a circuit diagram for showing an example of a full-capacitance bridge type sensor element 9c of a capacitance type sensor interface circuit according to an embodiment 3 of the present invention. As indicated in FIG. 11, terminals 3 of two sets of differential capacitance type sensor elements are commonly connected. This is seen from such a structure that in an acceleration sensor indicated in FIG. 13, the mass member 1 for receiving inertia force owns a displacement sensitivity as to one axis (X axis), but also owns displacement sensitivities as to other axes (y axis and z axis), namely a multi-axes acceleration sensor additionally provided with such fixed electrodes capable of detecting these displacement. FIG. 11 shows a circuit connection in the case of a 2-axes detecting type acceleration sensor.

In such a case, the circuit arrangement shown in FIG. 5 is utilized, the measurement timing of the respective axes is controlled by the switch and the reference power source 21 of the block circuit MUX, so that sensor outputs corresponding to the respective axes can be obtained.

As a result, in this case, since the impedance converting circuit 20 is commonly used for these sensor elements, the resultant circuit scale can be reduced.

EMBODIMENT 4

Figure 12:
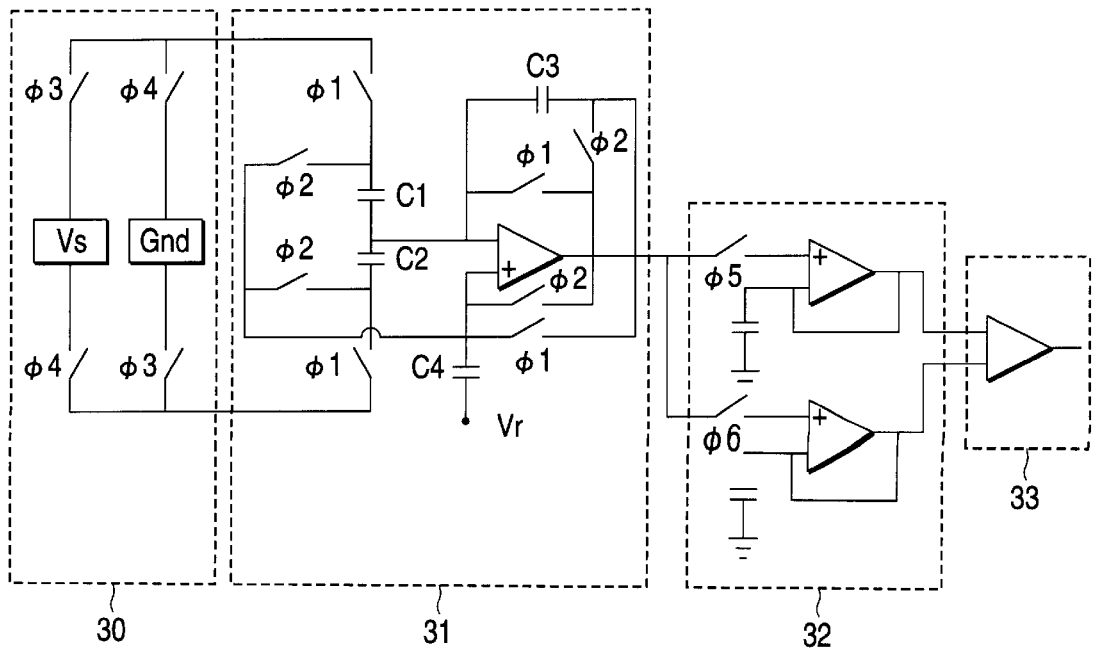
FIG. 12 is a circuit diagram for representing a capacitance type sensor interface circuit according to an embodiment 4 of the present invention.

FIG. 12 is a circuit diagram for indicating an arrangement of a capacitance type sensor interface circuit according to an embodiment 4 of the present invention. In this interface circuit, a power source changer 30, a sample/hold circuit 32, and a differential amplifier 33 are additionally provided with a single differential capacitance type sensor, and an impedance converter 31 using one set of OP amplifier, so that the resultant sensor sensitivity can be increased twice.

At the clock timing $\phi 3$ and $\phi 4$ shown in FIG. 6, a control operation is carried out as to whether the power source Vs is connected to the C1 side or the C2 side. At the clock timing $\phi 5$ and $\phi 6$, outputs from the impedance converter 31 produced in the respective power source connections are sampled and held. A difference between the outputs held by the differential amplifier 33 is calculated.

A sampled value at the clock timing $\phi 5$:

$$V5=\{C1/(C1+C2)\}Vs$$

A sampled value at the clock timing $\phi 6$:

$$V6=\{C2/(C1+C2)\}Vs$$

Then, a differential output Vd can be satisfied:

$$Vd = V5 - V6$$
$$= \{(C1 - C2)/(C1 + C2)\}Vs$$
$$= S \cdot Vs$$

As a consequence, the resultant sensitivity can be increased two times higher than that of the conventional system (only one impedance converter).

According to this embodiment 4 of the present invention, since the sensor sensitivity is increased twice, the DC temperature offset drift (indicated per sensitivity) contained in the outputs, which is caused by the OP amplifier, can be reduced by ½.

It should be noted that the present invention is not limited to the above-described embodiments, but may be modified. For example, it is also possible to utilize the more stable potential at the non-inverting input terminal of the OP amplifier as the output of the detecting circuit. Furthermore, a low-pass filter and an amplifier may be employed at a post stage in order to eliminate noise produced during the switching operation, and to control the gain.

Moreover, a high-pass filter for cutting out the low frequency signals may be provided. Alternatively, a switched capacitor filter may be utilized as these filters.

As previously described, in accordance with the first arrangement of the present invention, the capacitance type sensor interface circuit is characterized by that in a switched capacitor type interface circuit connected to a capacitance type sensor having two capacitances C1 and C2, at least one of values of which is varied, the switched capacitor type interface circuit is comprised of an OP amplifier A1 in which a feedback/sampling capacitor C3 is connected between an output terminal thereof and an inverting input terminal thereof; and a holding capacitor C4 connected between a non-inverting terminal of the OP amplifier A1 and a reference voltage source; wherein: one ends of the respective capacitors C1, C2, C3 are connected to the inverting input terminal of the OP amplifier A1; at timing $\phi 1$ of a switching cycle, the other ends of the respective capacitors C1, C2 are connected to a power source and the capacitor C3 is short-circuited; at timing $\phi 2$ thereof, the other ends of the capacitors C1, C2 and an output terminal of the OP amplifier A1 are connected to the non-inverting input terminal of the OP amplifier A1; and the switched capacitor type interface interface circuit is further comprised of: a multiplexer for sequentially connecting a plurality of the capacitance type sensors to the capacitance type sensor interface circuit in a second switching cycle having a time period longer than time periods of the switching cycles $\phi 1$ and $\phi 2$; and a plurality of sample/hold circuits whose quantity is equal to those of the plural capacitance type sensors, which are sequentially connected to the capacitive type sensor interface circuit in response to the connections of the plural capacitance type sensors in the second switching cycle.

Since the capacitance type sensor interface circuit can be arranged by only one set of the OP amplifier as the active element, and by the two capacitors C3 and C4 other than the capacitors C1 and C2 used to constitute the sensor element as other passive elements, this interface circuit can be made by a very simple arrangement. Even when the sensor circuit is manufactured in the ASIC form, the sensor circuit can be made in low cost. Also, the impedance converting circuits which are conventially required for the respective sensors can be combined to constitute a single impedance converting circuit, and are commonly used to all of the sensor elements. There are such effects that the compact capacitance type sensor interface circuit with the simple structure can be made in low cost.

Also, the capacitance type sensor interface circuit, according to the second arrangement of the present invention, is featured by that in the first arrangement, the capacitance type sensor corresponds to two sets of capacitance type sensors used in a full-bridge connection; and the capacitance type sensor interface circuit is further comprised of a differential amplifier circuit for outputting a difference in output voltages of two sets of the sample/hold circuits provided in correspondence with two sets of the capacitance type sensors. Accordingly, there are such advantages that the sensor sensitivity can be improved, and the compact capacitance type sensor interface circuit with the simple structure can be made in low cost.

Also, the capacitance type sensor interface circuit, according to the third arrangement of the present invention, is featured by that in the second arrangement, the multiplexer connected to one set of the capacitance type sensor, alternately reverses the connection to the power source in the second switching cycle with respect to one set of the capacitance type sensor. As a consequence, there are such effects that the sensor sensitivity can be improved, and the compact capacitance type sensor interface circuit with the simple arrangement can be made in low cost.

What is claimed is:

1. A capacitance type sensor interface circuit characterized by that in a switched capacitor type interface circuit connected to a capacitance type sensor having two capacitances C1 and C2, at least one of values of which is varied, said switched capacitor type interface circuit is comprised of an OP amplifier A1 in which a feedback/sampling capacitor C3 is connected between an output terminal thereof and an inverting input terminal thereof; and a holding capacitor C4 connected between a non-inverting terminal of said OP amplifier A1 and a reference voltage source;

wherein one ends of the respective capacitors C1, C2, C3 are connected to the inverting input terminal of said OP amplifier A1;

wherein at timing $\phi1$ of a switching cycle, the other ends of the respective capacitors C1, C2 are connected to a high and a low power source, respectively, and said capacitor C3 is shortcircuited;

wherein at timing $\phi2$ thereof, the other ends of said capacitors C1, C2 and an output terminal of said OP amplifier A1 are connected to the non-inverting input terminal of said OP amplifier A1; and wherein said switched capacitor type interface interface circuit further comprises:

a multiplexer for sequentially connecting a plurality of said capacitance type sensors to said capacitance type sensor interface circuit in a second switching cycle having a time period longer than time periods of said switching cycles $\phi1$ and $\phi2$; and a plurality of sample/hold circuits whose quantity is equal to those of said plural capacitance type sensors, which are sequentially connected to said capacitive type sensor interface circuit in response to the connections of said plural capacitance type sensors in said second switching cycle.

2. A capacitance type-sensor interface circuit as claimed in claim 1 wherein the number of said capacitance type sensors used in a full-bridge connection; and said capacitance type sensor interface circuit is further comprised of a differential amplifier circuit for outputting a difference between output voltages of two of said sample/hold circuits.

3. A capacitance type sensor interface circuit as claimed in claim 2 wherein said multiplexer connected to one of said capacitance type sensors, alternately reverses the connection to the power sources in said second switching cycle with respect to the other one of said capacitance type sensors.

* * * * *